United States Patent [19]

Pascucci

[11] Patent Number: 5,764,570

[45] Date of Patent: Jun. 9, 1998

[54] CURRENT DETECTING CIRCUIT

[75] Inventor: Luigi Pascucci, Giovanni, Italy

[73] Assignee: SGS-Thomson Microelectronics, S.r.l., Agrate Brianza, Italy

[21] Appl. No.: 691,796

[22] Filed: Aug. 2, 1996

[30] Foreign Application Priority Data

Aug. 3, 1995 [EP] European Pat. Off. ............ 95830354

[51] Int. Cl.[6] ...................................................... G11C 7/00
[52] U.S. Cl. ................. 365/185.21; 365/78; 365/189.12; 365/185.2
[58] Field of Search .......................... 365/78, 189.12, 365/185.24, 185.21, 185.2

[56] References Cited

U.S. PATENT DOCUMENTS 4,884,241  11/1989  Tanaka et al. .......................... 365/210
5,654,912  8/1997  Hasegawa et al. .................. 365/189.12

FOREIGN PATENT DOCUMENTS 4884421  of 0000  European Pat. Off. .
0514350  5/1992  European Pat. Off. .

Primary Examiner—David C. Nelms
Assistant Examiner—Michael T. Tran
Attorney, Agent, or Firm—Robert Groover; Betty Formby; Matthew S. Anderson

[57] ABSTRACT

A reading circuit for a multibit register has a differential stage that is configured as an output latch by one of two control phases required by the circuit after the discrimination phase of a reading cycle a single NOR gate, the output of which is provided with anti-overshoot means, enables the performance of a reading cycle. An input of the differential stage, is connectable to a common sensing line to which all the cells of the register are coupled in an OR configuration, while the other input is connectable to a reference current generator.

21 Claims, 6 Drawing Sheets

5,764,570

1
CURRENT DETECTING CIRCUIT

CROSS-REFERENCE TO RELATED APPLICATION

This application claims priority from EP 95830354.7, filed Aug. 3, 1995, which is hereby incorporated by reference. However, the content of the present application is not necessarily identical to that of the priority application.

BACKGROUND AND SUMMARY OF THE INVENTION

The present invention refers to a circuit for reading the information stored in a cell of a programmable register according to a differential current sensing system that employs a differential amplifier and an output latch circuit for storing a datum read from the register.

The implementation of redundancy systems and/or circuits which (as a function of a certain programming to be carried out on the finished device) permit the replacement and/or modification of particular operations of some circuits and/or the modification of circuit streams, requires the use of a plurality of registers (often multibit registers) needed for coding and/or recognizing, on the ground of a contingent programming, those situations that require the modification of a certain path in a certain circuit of the device.

Prior European patent applications No. 95830020.4, filed on Jan. 26, 1995, and No. 95830133.5, filed on Apr. 4, 1995, of the same applicant, describe programmable registers for operations of coincidence and jump and for coding operations whereby all the register cells are substantially connected in an OR configuration to a single current detecting line (CDL) allowing for the employment of a single reading circuit for each register. The content of these two above stated patent applications is herein incorporated by reference.

The single reading circuit of a programmable register should provide for a high reading speed and should also have a control network that can be easily enabled and capable of ensuring an absolute reliability during the reading process of an extractable datum from the programmable register.

The reading of programmable nonvolatile memory device systems (EPROMs, EEPROMs, FLASH-EPROMs, etc.) is a technical problem which has promoted the development of numberless reference systems and sensing (differential) amplifiers. The below indicated documents represent a selection of known solutions for reading a certain datum registered in a nonvolatile manner in a programmable cell. The content of the following and previous documents is herein incorporated by reference: U.S. Pat. No. 5,132,576, "Sense amplifier having load device providing improved access time"; U.S. Pat. No. 5,109,187, "CMOS voltage reference"; U.S. Pat. No. 4,965,473, "EPROM low voltage sense amplifier"; U.S. Pat. No. 4,908,795, "Semiconductor integrated circuit device with built-in memories"; U.S. Pat. No. 4,903,237, "Differential sense amplifier circuit for high speed ROMS, and flash memory devices"; U.S. Pat. No. 4,813,018, "Nonvolatile semiconductor memory device"; U.S. Pat. No. 4,807,188, "Nonvolatile memory device with a high number of cycle programming endurance"; U.S. Pat. No. 4,785,423, "Current limited EPLD array"; U.S. Pat. No. 4,783,764, "Semiconductor integrated circuit device with built-in memories, and peripheral circuit which may be statically or dynamically operated"; U.S. Pat. No. 4,775,958, "Semiconductor memory system"; U.S. Pat. No 5,327,379, "Current offset sense amplifier of a modulated current or current unbalanced type for programmable memories"; U.S.

2

Pat. No. 5,355,333, "Dynamic reference system for sense amplifier". All of these materials are hereby incorporated by reference.

These known reading systems are relatively complex either from a circuit point of view or in terms of the required control circuitry for ensuring a correct performance by the discriminating and reading circuits themselves.

The innovations disclosed herein provide extremely simple and effective reading circuits, requiring only two control phases that can be generated by a single logic network, particularly suitable for producing an output logic configuration in function of the state of at least one of the programmable cells that make up the register.

The reading circuit of the invention employs a reference current generator equivalent to a half (or to a twofold multiple) of the current absorbed by a programmable cell of the register in a virgin condition. The reference current generator is connectable by means of a switch to a first input node of a differential amplification (discrimination) stage whose second input is connectable through a second switch to a common reading node of the register. A differential amplifier of discrimination is composed by a generator controlled by a bias current, by a pair of identical input transistors cross-coupled with a pair of identical complementary load transistors, and configurable in such a way of realizing an output latch stage during a storing and reading phase of the output datum that follows a stimulating and discriminating phase. The circuit does not include any preload current path and is controlled by only two phases.

A single logic NOR gate 200 controls the switches that connect the inputs of the differential amplifying stage to the reference current generator and to the common read node of the register in phase with each other, in response to a control phase that also enables a bias current generator of the differential stage. The other control phase commands an equalization switch of the load transistors of the input pair of transistors of the differential stage, which, by switching on, configures the differential discriminating stage into a latch, capable of definitively amplifying and storing the datum extracted from the register.

A relatively simple logic network generates the two control phases and ensures that the phase that controls the equalization switch (of the loads) and that configures the output latch stage, assumes a high logic state with a certain delay in respect to the descending front of the other phase toward a low logic state and, above all, that it returns to a low logic state with a certain anticipation in respect to the rising front of said other phase toward a high logic state.

The reliability of the reading process of the data stored in the register is also enhanced by employing anti-overshoot transistors, that is, transistors that limit the voltage excursion toward the circuit supply potential, both for the output node of the control logic gate and for the input nodes of the differential amplifying stage.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
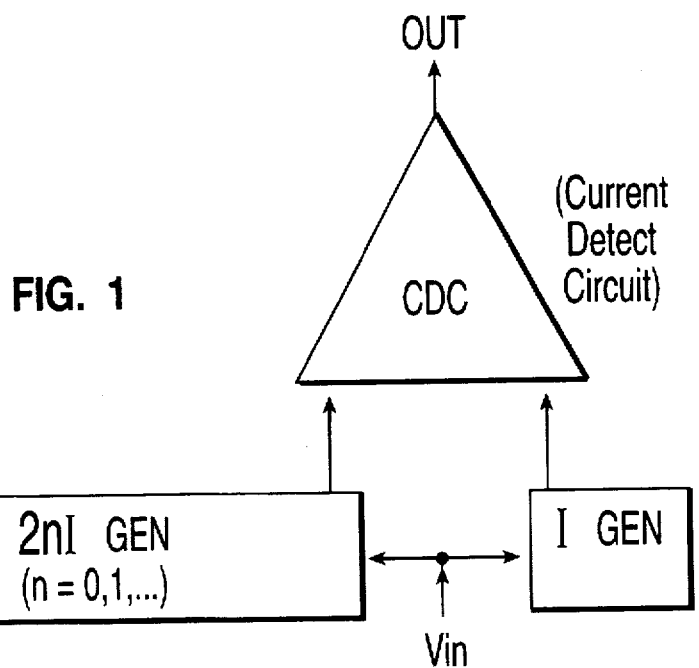
FIG. 1 is a basic diagram of a reading circuit for an n+1 bit programmable resister.

The numerous innovative teachings of the present application will be described with particular reference to the presently preferred embodiment (by way of example, and not of limitation), in which:

With reference to FIG. 1, the reading circuit of the invention has a differential architecture, in which the reference side contains a generator of a constant current Igen of a value that can be equal to a half of the current absorbed by a register cell in a virgin state (in the case where each programmable cell of the register employs two nonvolatile memory elements in parallel) or double of the current absorbed by a register cell in a virgin state (in the case where each programmable cell of the register employs a single nonvolatile memory element). In the illustrated examples the first option is assumed, that is where each programmable register cell employs two nonvolatile memory elements so that the reference current generator Igen may be realized advantageously by a cell comprising a single nonvolatile memory element similar to the elements that form the register cells, in a virgin state.

Figure 2:
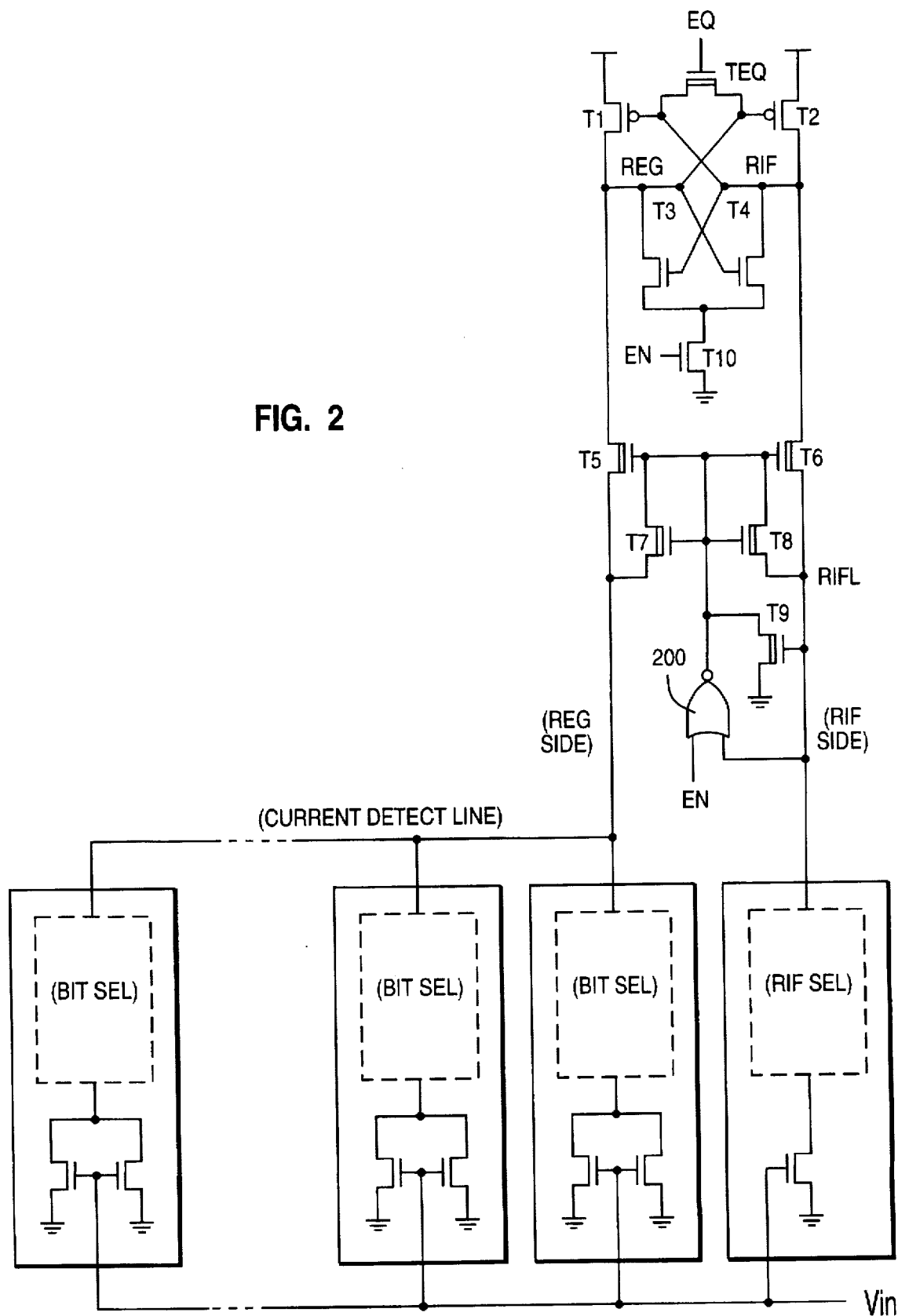
FIG. 2 shows a reading circuit of the invention.

The scheme of the reading circuit according to such an embodiment is shown in FIG. 2.

The differential amplifying stage is composed of a pair of input transistors T3 and T4, a pair of identical complementary load transistors T1 and T2, and a bias current generator T10, which is controlled by the control phase EN.

The n-channel input transistors T3 and T4 are cross-coupled to the p-channel load transistors T1 and T2 by a network that is configurable by a switch TEQ, controlled by the control phase EQ. When the TEQ switch is in a conduction state, it ensures an equalization of the two branches of the differential reading circuit (in other words the register branch REG SIDE and the reference branch RIF SIDE) ensuring identical bias conditions of the load transistors T1 and T2. When the TEQ switch is turned off by the control phase EQ, following a stimulation of the circuit by the EN phase, the circuit becomes configured as a latch, which definitively amplifies and stores the extracted datum, or in other words accentuates and stabilizes to the appropriate logic level the unbalance of the differential input stage attained in the preceding phase of discrimination of the reading cycle. This according to an approach as described in the above-identified U.S. Pat. Nos. 5,327,379 and 5,355,333.

Differently though from said known circuits, a single logic NOR gate 200 commands the switches (cascode transistors) T5 and T6 in function of the EN phase.

The anti-overshoot transistor T9, of the so-called natural type, that is having a particularly low turn-on threshold, prevents the output node of the logic gate NOR, that is the driving node of the switches T5 and T6, from evolving abruptly towards the full supply voltage of the circuit, which could otherwise favor the occurrence of overshoot phenomena and make critical the delicate discrimination phase of the reading cycle.

For the same purpose of countering overshoots of the respective input nodes of the discriminating differential stage the T7 and T8 transistors, also of a low threshold or natural type are used.

Figure 3:
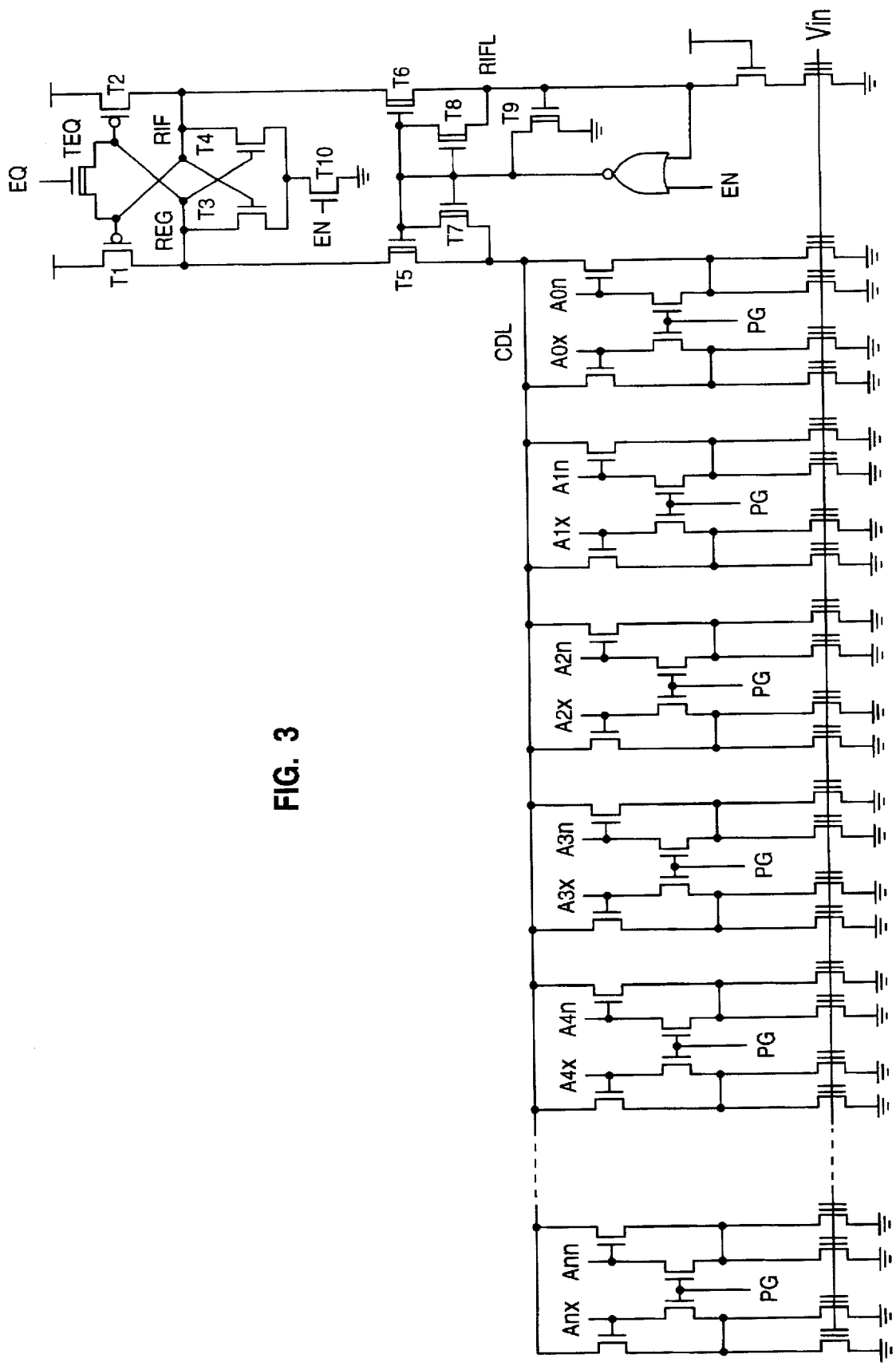
FIG. 3 shows of a register for implementing a "jump function" employing a single reading circuit of the invention.

In FIG. 3 is shown a complete circuit of a programmable register for recognizing "jump conditions" (reconfiguration of a certain circuit), composed of n+1 programmable cells substantially connected in an OR configuration to a unique current detection line (CDL), according to the architecture described in the European patent application No. 95830020.4, whose description is herein incorporated by reference. The register uses a single reading circuit realized according to the present invention.

Figure 4:
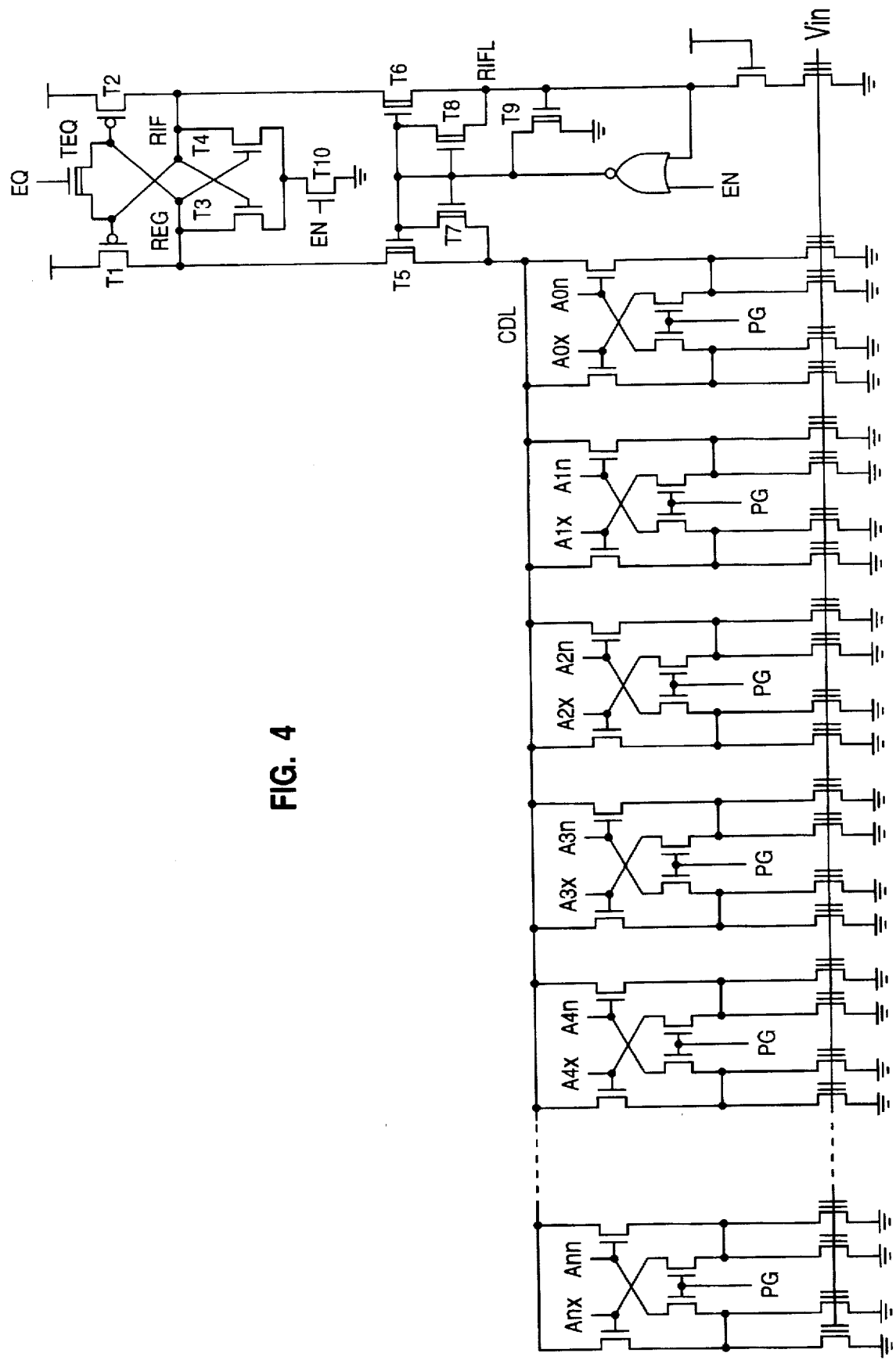
FIG. 4 shows of a coding register employing a single reading circuit of the invention.

FIG. 4 shows the circuit of a coding multibit register according to the architecture described in the European patent application No. 95830133.5, whose description is herein incorporated by reference. Even in this case the only reading circuit of the register is advantageously realized according to the present invention.

Figure 5:
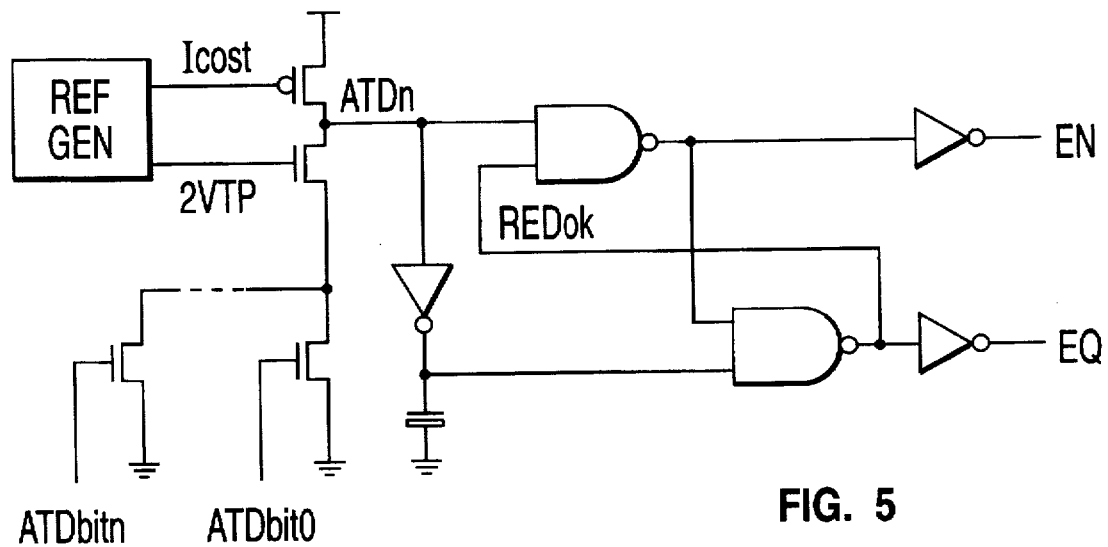
FIG. 5 shows the basic scheme of a circuit for generating the two control phases of the reading circuit of the invention.

With reference to the diagram of FIG. 5, the circuit section on the left side of the figure represents a typical detecting circuit of any transition that may take place in an "array" of addresses (ATDbit0, . . . ATDbitn), as for example of a memory matrix or of other similar circuit. The "glitches" coming from the address lines are placed in an OR configuration and the relative common node, which node for a certain number of address lines (typically >=19 in memory arrays) can have a relatively high capacitance, is advantageously decoupled by means of a cascode stage, so that the ATD! node is able to change rapidly its potential. In practice, on the output node of the transition detecting stage, is generated a stimulation signal ATD! (a transition from low to high) that represents an exceptionally fast response to the occurrence of a transition of any type in any one of the n+1 addresses.

Of course, this stimulation signal ATD! can be generated in any other suitable manner, according to one of the innumerable techniques that are usually employed for this purpose.

The logic network that generates the two control phases EN and EQ of the reading circuit of the invention is illustrated in the remaining part (in the right side) of the diagram of FIG. 5.

The particularly simple network essentially requires the use of two-input gates NAND1 and NAND2, three inverters INV1, INV2 and INV3 and a capacitance C for regulating the duration of the phases duration EN and EQ that are produced whenever the generating network is stimulated by the signal ATD!.

Figure 6:
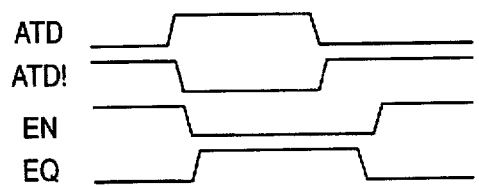
FIG. 6 shows the control phases that are generated.

The form of the logic signals are shown in FIG. 6. In particular it is highlighted the delay, that is introduced by the logic network, of the rising front of the phase EQ in respect to the descending front of the phase EN and conversely the anticipation of the descending front of the phase EQ in respect to the rising front of the phase EN. This last condition has a fundamental importance for a correct functioning of the reading circuit of the invention during the crucial discrimination phase performed by the differential amplifying stage.

The functioning of the reading circuit of the invention illustrated in the figures has been tested by computer simulation for the specific case in which to the common read node CDL of the register was connected a cell in a virgin state (that is in a conductive state). The relevant signals for a complete reading cycle are shown in FIG. 7.

Figure 8:
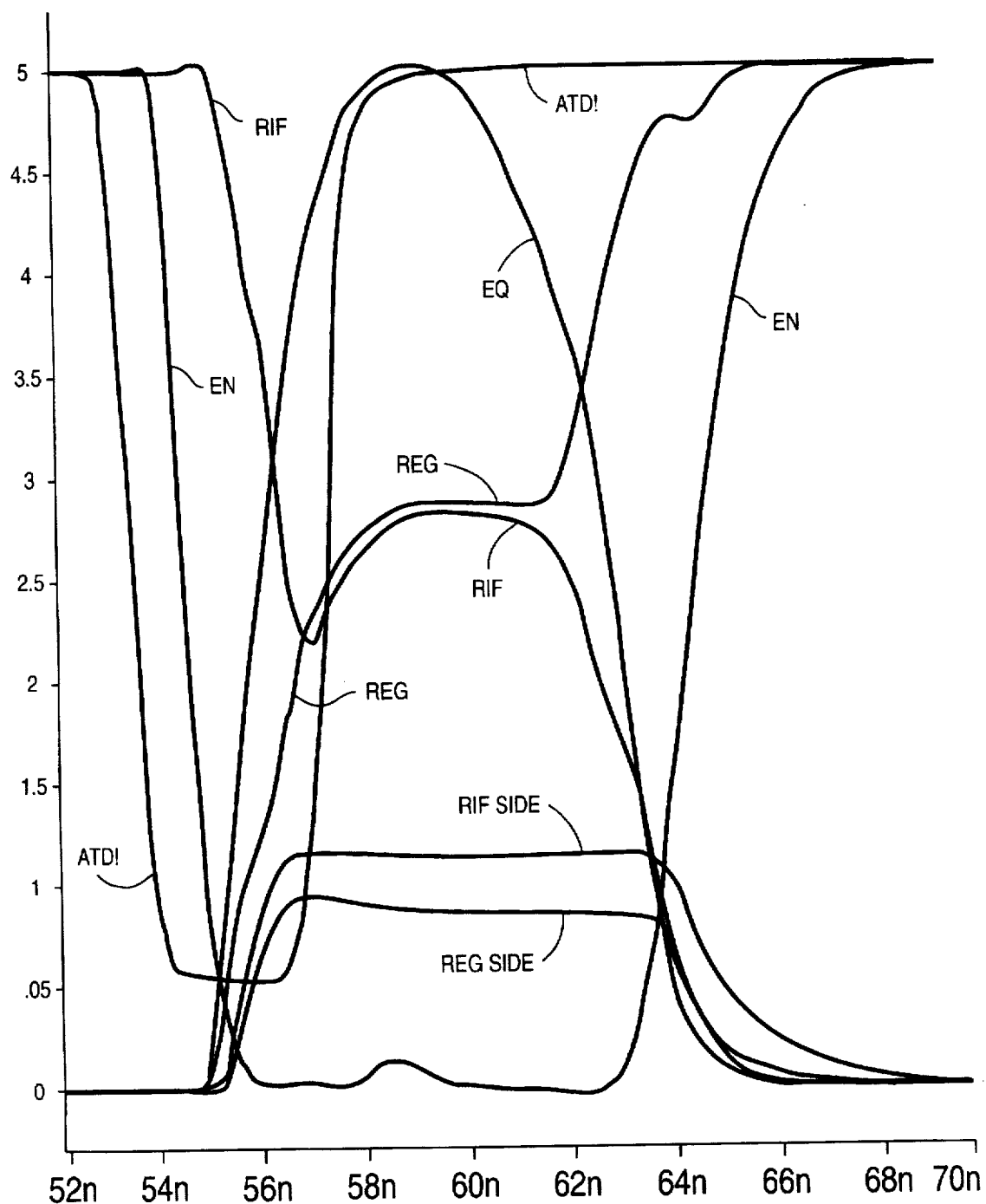
FIG. 8 shows the significant signals in the case a programmed cell is connected to the common read node of the register.

The simulation was repeated for the case in which to the common read node CDL is connected a programmed cell (that is a cell in a nonconductive state) and the relative signals are depicted in FIG. 8.

Figure 7:
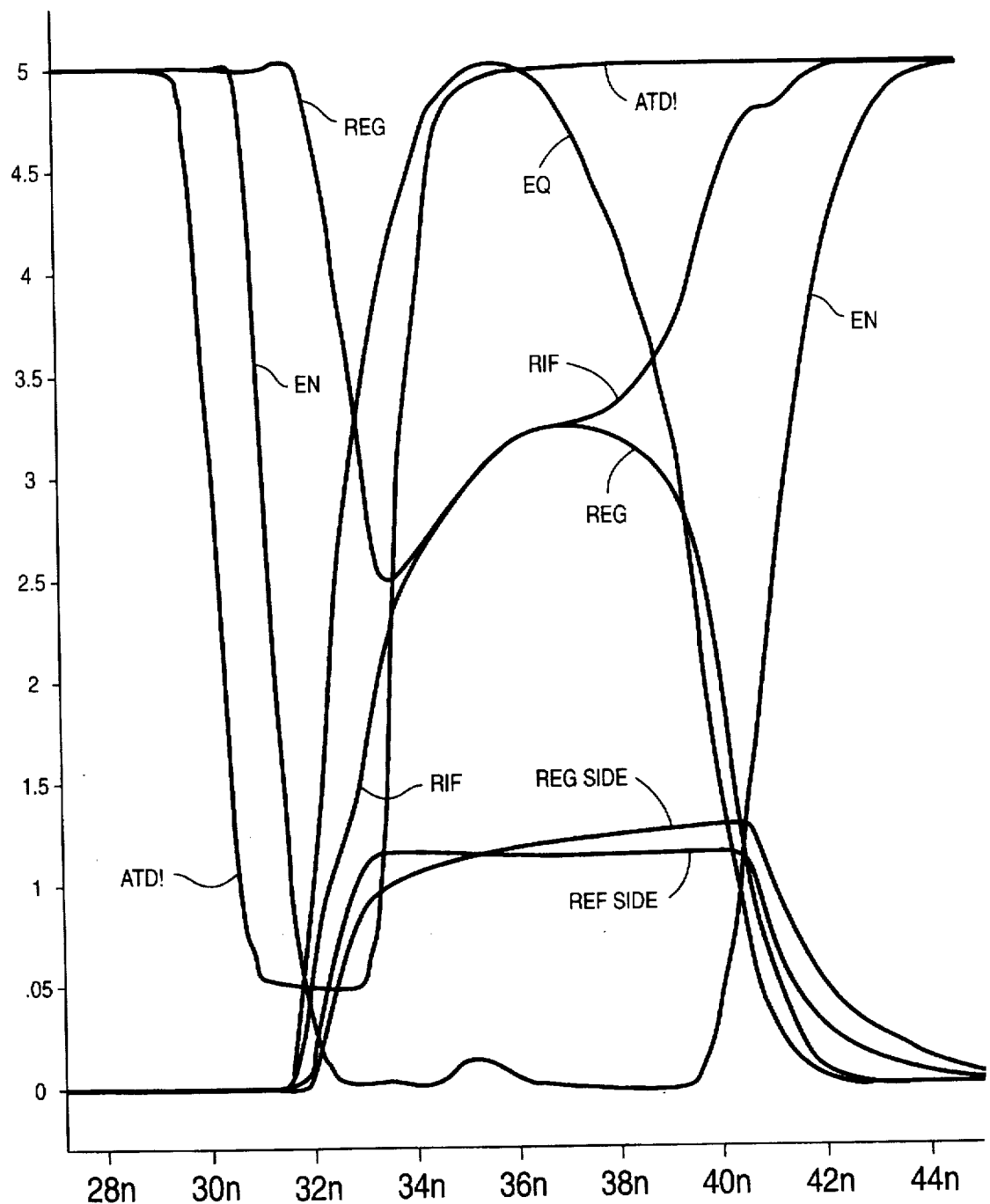
FIG. 7 shows the significant signals in the case where a virgin cell is connected to the common read node of the register.

The diagrams of FIGS. 7 and 8 demonstrate the exceptional speed of the reading circuit and its intrinsic reliability.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given.

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, as will be obvious to those of ordinary skill in the art, other circuit elements can be added to, or substituted into, the specific circuit topologies shown.

For another example, within the constraints well-known to those of ordinary skill, a variety of well-known amplifier configurations can be substituted for those shown.

What is claimed is:

1. A reading circuit for a programmable register comprising:
   a reference current generator connectable by a first switch to a first input of a differential amplifying stage, whose input transistors are cross-coupled to a pair of identical complementary load transistors and configurable as an output latch,
   a second input of the differential amplifying stage being connectable by a second switch to a common read node of the register,
   at least a third equalization-configuration switch functionally connected between the gates of said pair of load transistors and controlled by a first control phase, a current generator controlled by a second control phase biasing said differential stage;
   a single logic NOR gate controlling, in phase with each other, said first and second switch in response to said second control phase;
   at least a pair of anti-overshoot transistors driven by the output of said NOR gate and respectively connected between a gate and a source of said switches; and
   a generating circuit of said first and second control phases capable of ensuring that said first phase assumes a high logic state with a certain delay in respect to a descending front of the second phase toward a low logic state and returns to a low logic state with a certain anticipation in respect to a rising front of said second phase toward a high logic state.

2. The reading circuit according to claim 1, comprising an additional anti-overshoot transistor coupled between the output of said logic gate and a common ground node of the circuit and having a control gate coupled to an input of said logic gate which coincides with a current output terminal of said reference current generator.

3. The reading circuit defined in claim 1, wherein said phase generating circuit has an input to which a logic signal representative of a detected transition in an addressing circuit is applied, and comprising
   a first and second logic gate, to a first input of said first gate being applied said logic signal and to a first input of said second gate being applied the output signal of a first inverter INV1, to the input of which is applied the same logic signal while the output signal at one of said gates being applied to a second input of the other gate, respectively;
   a second inverter receiving as input the output signal of said first gate and producing as output said second control phase; and
   a third inverter receiving as input tho output signal of said second gate and producing as output said first control phase.

4. The reading circuit as defined in claim 1, wherein said third switch and said anti-overshoot transistors are MOS transistors with a low turn-on threshold, while all the other transistors are of an enhancement mode transistors.

5. The reading circuit of claim 1, wherein said register cells each include at least two floating-gate transistors connected to complementary nodes.

6. The reading circuit of claim 1, wherein said register cells each include at least four floating-gate transistors.

7. The reading circuit of claim 1, wherein said input transistors each have a threshold voltage whose magnitude is more than twice as large as the magnitude of the threshold voltage of said pair of anti-overshoot transistors.

8. The reading circuit of claim 1, wherein said input transistors each have a threshold voltage whose magnitude is more than three times as large as the magnitude of the threshold voltage of said additional anti-overshoot transistor.

9. A programmable register comprising:
   a plurality of register cells, each including at least one floating-gate memory cell, connected to selectably supply a programmation-dependent current to a common read node;
   and a reading circuit, connected to said common read node, which includes:
   a reference current generator connectable by a first switch to a first input of a differential amplifying stage, whose input transistors are cross-coupled to a pair of identical complementary load transistors and configurable as an output latch,
   the second input of the differential amplifying stage being connectable by a second switch to said common read node,
   at least a third equalization-configuration switch functionally connected between the gates of said pair of load transistors and controlled by a first control phase, a current generator controlled by a second control phase biasing said differential stage;
   a single logic NOR gate controlling, in phase with each other, said first and second switch in response to said second control phase;
   at least a pair of anti-overshoot transistors driven by the output of said NOR gate and respectively connected between a gate and a source of said switches; and
   a generating circuit of said first and second control phases capable of ensuring that said first phase assumes a high logic state with a certain delay in respect to a descending front of the second phase toward a low logic state and returns to a low logic state with a certain anticipation in respect to a rising front of said second phase toward a high logic state.

10. The register of claim 9, further comprising an anti-overshoot transistor coupled between the output of said logic gate and a common ground node of the circuit and having a control gate coupled to an input of said logic gate which coincides with a current output terminal of said reference current generator.

11. The register of claim 9, wherein said phase generating circuit has an input to which a logic signal representative of a detected transition in an addressing circuit is applied, and comprising

- a first and second logic gate, to a first input of said first gate being applied to said logic signal and to a first input of said second gate being applied to the output signal of a first inverter INV1, to the input of which is applied to the same logic signal while the output signal at one of said gates being applied to a second input of the other gate, respectively;
- a second inverter receiving as input the output signal of said first gate and producing as output said second control phase; and
- a third inverter receiving as input tho output signal of said second gate and producing as output said first control phase.

12. The register of claim 9, wherein said third switch and said anti-overshoot transistor are MOS transistors with a low turn-on threshold, while all the other transistors are of an enhancement mode transistors.

13. The register of claim 9, wherein said register cells each include at least two floating-gate transistors connected to complementary nodes.

14. The register of claim 9, wherein said register cells each include at least four floating-gate transistors.

15. The register of claim 9, wherein said input transistors each have a threshold voltage whose magnitude is more than twice as large as the magnitude of the threshold voltage of said pair of anti-overshoot transistors.

16. The register of claim 9, wherein said input transistors each have a threshold voltage whose magnitude is more than three times as large as the magnitude of the threshold voltage of said additional anti-overshoot transistor.

17. An integrated circuit programmable structure, comprising:

- a plurality of register cells, each including at least one floating-gate transistor, operatively connected to selectably supply a programmation-dependent current to a common read node;
- a differential amplifier comprising logic transistors, and having first and second inputs which are operatively connected, through a pair of cascode transistors, to said common read node and to a reference current generator, respectively;
- at least a pair of anti-overshoot transistors both driven by an output of a logic gate, and respectively connected between said output and a repsective one of said common read node and said reference current generator;
- an additional anti-overshoot transistor having a gate connected to one of said common read node and said reference current generator, and current-carrying terminals connected to load said output of said logic gate; and
- a generating circuit of said first and second control phases capable of ensuring that said first phase assumes a high logic state with a certain delay in respect to a descending front of the second phase toward a low logic state and returns to a low logic state with a certain anticipation in respect to a rising front of said second phase toward a high logic state.

18. The integrated circuit of claim 17, wherein said register cells each include at least two floating-gate transistors connected to complementary nodes.

19. The integrated circuit of claim 17, wherein said register cells each include at least four floating-gate transistors.

20. The integrated circuit of claim 17, wherein said input transistors each have a threshold voltage whose magnitude is more than twice as large as the magnitude of the threshold voltage of said pair of anti-overshoot transistors.

21. The integrated circuit of claim 17, wherein said input transistors each have a threshold voltage whose magnitude is more than three times as large as the magnitude of the threshold voltage of said additional anti-overshoot transistor.

* * * * *